(12) United States Patent
Kon

(10) Patent No.: US 10,459,178 B2
(45) Date of Patent: Oct. 29, 2019

(54) OPTICAL RECEPTACLE, OPTICAL MODULE, AND MEASUREMENT METHOD

(71) Applicant: Enplas Corporation, Saitama (JP)

(72) Inventor: Ayano Kon, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 16/067,827

(22) PCT Filed: Dec. 16, 2016

(86) PCT No.: PCT/JP2016/087470
§ 371 (c)(1),
(2) Date: Jul. 3, 2018

(87) PCT Pub. No.: WO2017/119259
PCT Pub. Date: Jul. 13, 2017

(65) Prior Publication Data
US 2019/0011651 A1    Jan. 10, 2019

(30) Foreign Application Priority Data
Jan. 4, 2016  (JP) ................................ 2016-000128

(51) Int. Cl.
*G02B 6/42*       (2006.01)
*H01L 31/0232*    (2014.01)
*H01S 5/022*      (2006.01)

(52) U.S. Cl.
CPC .............. *G02B 6/423* (2013.01); *G02B 6/42* (2013.01); *G02B 6/4214* (2013.01); *H01L 31/0232* (2013.01); *H01S 5/022* (2013.01)

(58) Field of Classification Search
CPC ......... G02B 6/4214; G02B 6/42; G02B 6/423
See application file for complete search history.

(56) References Cited

U.S. PATENT DOCUMENTS 7,050,678 B1 *  5/2006  Isono ................... G02B 6/423
                                                    385/15
7,556,440 B2 *  7/2009  Birincioglu .......... G02B 6/4206
                                                    385/33
(Continued)

FOREIGN PATENT DOCUMENTS

JP    2013-235243 A    11/2013
WO    2016/148896 A1    9/2016

OTHER PUBLICATIONS

International Search Report from International Application No. PCT/JP2016/087470 dated Mar. 14, 2017.

*Primary Examiner* — Thomas A Hollweg
*Assistant Examiner* — Mary A El-Shammaa
(74) *Attorney, Agent, or Firm* — Brundidge & Stanger, P.C.

(57) ABSTRACT

This optical receptacle is provided with: a first optical surface; a second optical surface; a first recess; a second recess; an inclined surface; insertion holes; through holes; and reference parts. The second optical surface and the inclined surface face each other at inside surfaces of the first recess. The inclined surface is inclined so as to extend away from the second optical surface as the inclined surface approaches an opening of the first recess. First openings which are open at the inclined surface and second openings which are open at an inside surface of the second recess are provided at both ends of the linear insertion holes. The thorough holes face the second openings on the central axes of the insertion holes. The reference parts are provided to the surface at the side at which the first recess and the second recess are open.

8 Claims, 5 Drawing Sheets

(56) References Cited

U.S. PATENT DOCUMENTS

| | | | |
|---|---|---|---|
| 9,097,863 B2* | 8/2015 | Yu | G02B 6/3826 |
| 9,140,866 B2* | 9/2015 | Lee | G02B 6/43 |
| 9,739,962 B2* | 8/2017 | Brenner | G02B 6/428 |
| 9,766,416 B1* | 9/2017 | Kim | G02B 6/32 |
| 9,804,351 B2* | 10/2017 | Shibuya | H01S 5/02284 |
| 2003/0002814 A1* | 1/2003 | Dudoff | G02B 6/38 |
| | | | 385/78 |
| 2004/0037510 A1* | 2/2004 | Mukouda | G02B 6/3833 |
| | | | 385/71 |
| 2006/0263003 A1* | 11/2006 | Asai | G02B 6/4204 |
| | | | 385/14 |
| 2008/0193087 A1* | 8/2008 | Ishida | G02B 6/327 |
| | | | 385/84 |
| 2010/0135618 A1* | 6/2010 | Howard | G02B 6/3829 |
| | | | 385/79 |
| 2010/0220957 A1* | 9/2010 | Asahi | G02B 6/423 |
| | | | 385/39 |
| 2011/0123151 A1* | 5/2011 | Zbinden | G02B 6/4214 |
| | | | 385/33 |
| 2012/0219251 A1* | 8/2012 | Kuroda | G02B 6/122 |
| | | | 385/14 |
| 2013/0266262 A1 | 10/2013 | Nishimura et al. | |
| 2014/0153881 A1* | 6/2014 | Liff | G02B 6/4214 |
| | | | 385/89 |
| 2014/0321801 A1* | 10/2014 | Ellis-Monaghan | |
| | | | G02B 6/4214 |
| | | | 385/14 |
| 2018/0017744 A1 | 1/2018 | DeMeritt et al. | |

* cited by examiner

OPTICAL RECEPTACLE, OPTICAL MODULE, AND MEASUREMENT METHOD

TECHNICAL FIELD

The present invention relates to an optical receptacle including an insertion hole for inserting an optical transmission member, and an optical module including the optical receptacle, and a method of measuring the position and the shape of the insertion hole in the optical receptacle.

BACKGROUND ART

Conventionally, in optical communications using an optical transmission member such as an optical fiber and an optical waveguide, an optical module including a light emitting element such as a surface-emitting laser (for example, a vertical cavity surface emitting laser (VCSEL)) has been used. The optical module includes one or more photoelectric conversion elements (light-emitting element or light-receiving element), and a light coupling element for transmission or reception (hereinafter referred to as "optical receptacle"). An optical receptacle in which a structure for holding an optical transmission member is formed is known (see, for example, PTL 1).

FIG. 1 is a sectional view illustrating a configuration of optical module 10 disclosed in PTL 1. Optical module 10 disclosed in PTL 1 includes substrate 20, photoelectric conversion element 30 installed on substrate 20, and optical receptacle 40 formed of a transparent material. Optical receptacle 40 includes first optical surface 41; reflection surface 42; second optical surface 43; first recess 44 and second recess 45 that open at the top surface of optical receptacle 40; first insertion hole 46 configured for insertion of optical transmission member 50 from second recess 45 side and having both ends respectively open to first recess 44 and second recess 45; and second insertion hole 47 communicating between second recess 45 and outside and configured for insertion of optical transmission member 50 from the outside. In the following, the opening of first insertion hole 46 opening at the inner side surface of first recess 44 is also referred to as "first opening 461," and the opening of first insertion hole 46 opening at the inner side surface of second recess 45 is also referred to as "second opening 462."

First optical surface 41 allows incidence of light emitted from photoelectric conversion element 30. Reflection surface 42 reflects, toward second optical surface 43, light incident on first optical surface 41. Second optical surface 43 emits, toward the end surface of optical transmission member 50, light passing through the inside of optical receptacle 40 after entering optical receptacle 40 from first optical surface 41. In optical module 10 disclosed in PTL 1, optical transmission member 50 is inserted from the outside through second insertion hole 47, second recess 45 and first insertion hole 46 in this order, and is thus connected to optical receptacle 40. At this time, first insertion hole 46 functions as the guide of optical transmission member 50, and optical transmission member 50 is connected to optical receptacle 40 such that end surface 51 of optical transmission member 50 makes contact with second optical surface 43. In this manner, light emitted from photoelectric conversion element 30 is optically coupled to end surface 51 of optical transmission member 50 through first optical surface 41, reflection surface 42 and second optical surface 43.

CITATION LIST

Patent Literature

PTL 1
Japanese Patent Application Laid-Open No. 2013-235243

SUMMARY OF INVENTION

Technical Problem

In view of optically coupling photoelectric conversion element 30 and end surface 51 of optical transmission member 50 in an appropriate manner by use of optical receptacle 10 disclosed in PTL 1, the positional accuracy of first insertion hole 46 is an important point. The position and the shape of first insertion hole 46 can be measured with a non-contact three-dimensional measurement device using a publicly known laser probe, for example. In optical receptacle 10 disclosed in PTL 1, second insertion hole 47 larger than first insertion hole 46 is formed at a position opposite to second opening 462 of first insertion hole 46. With this configuration, the position and the shape of second opening 462 can be correctly measured through second insertion hole 47 with a laser probe. On the other hand, second optical surface 43 is disposed at a position opposite to first opening 461 of first insertion hole 46. Accordingly, the laser probe cannot be installed a position opposite to first opening 461, and the position and the shape of first opening 461 cannot be correctly measured with the laser probe. Further, since first opening 461 is disposed at a surface parallel to the depth direction of first recess 44, it cannot be correctly measured also from the opening side of first opening 461 (the top surface side of optical receptacle 40) with the laser probe.

An object of the present invention is to provide an optical receptacle which can correctly measure the position and the shape of an insertion hole for inserting an optical transmission member even when an optical surface is disposed on the central axis of the insertion hole at a position opposite to one opening of the insertion hole. In addition, another object of the present invention is to provide an optical module including the above-mentioned optical receptacle. Further, another object of the present invention is to provide a method of measuring the position and the shape of an insertion hole for inserting an optical transmission member in an optical receptacle.

Solution to Problem

An optical receptacle according to an embodiment of the present invention is configured to be disposed between a photoelectric conversion element and an optical transmission member, and to optically couple the photoelectric conversion element and an end surface of the optical transmission member, the optical receptacle including: a first optical surface configured to allow incidence of light emitted from the photoelectric conversion element, or to emit, toward the photoelectric conversion element, light emitted from the end surface of the optical transmission member and passing through inside of the optical receptacle; a second optical surface configured to emit, toward the end surface of the optical transmission member, light incident on the first optical surface that passes through the inside of the optical receptacle, or to allow incidence of light emitted from the end surface of the optical transmission member; a first recess in which the second optical surface is disposed in a part of an inner side surface of the first recess; a second recess opening in a direction identical to a direction in which the first recess opens; a slope surface disposed opposite to the second optical surface in the inner side surface of the first recess, the slope surface being tilted such that a distance of the slope surface from the second optical surface increases toward an opening of the first recess; an insertion hole having a linear shape and including a first opening and a second opening disposed at respective ends of the insertion hole; a through hole formed opposite to the second opening on a central axis of the insertion hole and communicating between the second recess and outside of the optical receptacle; and a reference part disposed on a surface of the optical receptacle on a side on which the first recess and the second recess open. The first opening opens at the slope surface of the first recess, the second opening opens at an inner side surface of the second recess, and the insertion hole is configured for insertion of the optical transmission member from the second recess side.

An optical module according to an embodiment of the present invention includes: a substrate; a photoelectric conversion element disposed on the substrate; and the above-mentioned optical receptacle in which the first optical surfaces is disposed opposite to the photoelectric conversion element on the substrate.

A measurement method according to an embodiment of the present invention includes is a method of measuring a position and a shape of the insertion hole in the above-mentioned optical receptacle with a laser probe in a non-contact manner, the method including: preparing the optical receptacle according to the present invention; measuring a position and a shape of the second opening via the through hole based on a positional relationship between the second opening, and a reference surface and the reference part, measuring, from the reference surface side, an inclination angle of the slope surface; and measuring, from the reference surface side, a position and a shape of the first opening based on a positional relationship between the first opening on the slope surface and the reference part, and the inclination angle of the slope surface.

Advantageous Effects of Invention

According to the present invention, the position and the shape of an insertion hole for inserting an optical transmission member in an optical receptacle can be correctly measured. In addition, according to the present invention, the width and the inclination angle of the insertion hole can be correctly measured based on the measured position and shape of the insertion hole. Accordingly, the photoelectric conversion element and the end surface of the optical transmission member can be optically coupled with each other in an appropriate manner.

DESCRIPTION OF EMBODIMENTS

An embodiment of the present invention is elaborated below with reference to the drawings.

Configuration of Optical Module

Figure 1:
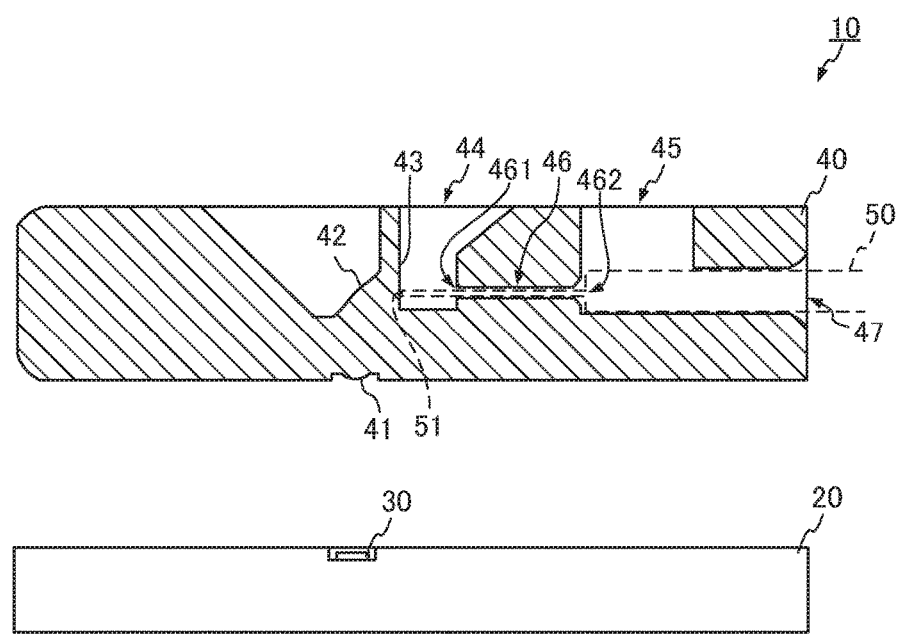
FIG. 1 illustrates a configuration of the optical receptacle disclosed in PTL 1.
Figure 2:
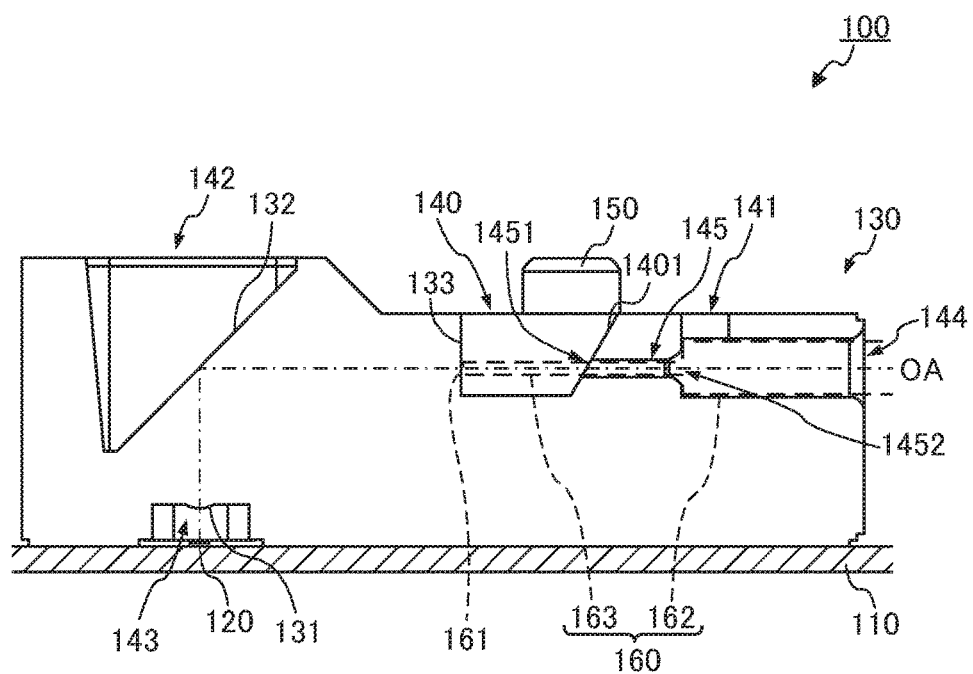
FIG. 2 is a sectional view illustrating a configuration of an optical module according to an embodiment of the present invention.

FIG. 2 is a sectional view illustrating a configuration of optical module 100 according to the embodiment of the present invention. In FIG. 2, the hatching of the cross-section of optical receptacle 130 is omitted to illustrate the light paths of optical receptacle 130. It is to be noted that, in FIG. 2, the dashed line indicates optical axis OA. It is to be noted that FIG. 2 illustrates a cross section of optical receptacle 130 taken along line A-A of FIG. 3C.

As illustrated in FIG. 2, optical module 100 includes substrate 110, photoelectric conversion element 120, and optical receptacle 130. Optical module 100 is used with optical transmission member 160 and optical receptacle 130 connected with each other.

On substrate 110, one or more photoelectric conversion elements 120, and optical receptacle 130 are disposed. A protrusion (not illustrated in the drawing) corresponding to positioning recess 146 of optical receptacle 130 described later is formed on substrate 110. Optical receptacle 130 can be fixed at a predetermined position with respect to photoelectric conversion element 120 disposed on substrate 110 by fitting the protrusion into positioning recess 146. The material of substrate 110 is not limited. Substrate 110 is, for example, a glass composite substrate, a glass epoxy substrate or the like.

Photoelectric conversion element 120 is a light-emitting element or a light-receiving element, and is disposed on substrate 110. In the present embodiment, six light-emitting elements and six light-receiving elements are disposed on substrate 110. In the present embodiment, six light-emitting elements (near side) and six light-receiving elements (depth side) are arranged on a straight line along the depth direction of FIG. 2. In a portion that functions as optical module 100 for transmission use, the light-emitting elements are used as photoelectric conversion element 120. In a portion that functions as optical module 100 for reception use, the light-receiving elements are used as photoelectric conversion element 120. Each light-emitting element is a vertical cavity surface emitting laser (VCSEL), for example. Each light-receiving element is a photodiode (PD), for example.

Optical receptacle 130 is disposed on substrate 110 such that one or more first optical surfaces 131 described later face one or more photoelectric conversion elements 120. Optical receptacle 130 optically couples photoelectric conversion element 120 and end surface 161 of optical transmission member 160 in the state where optical receptacle 130 is disposed between photoelectric conversion element 120 and optical transmission member 160. In a portion that functions as optical module 100 for transmission use, optical receptacle 130 emits, toward end surface 161 of optical transmission member 160, light emitted from photoelectric conversion element 120 (light-emitting element). In a portion that functions as optical module 100 for reception use, optical receptacle 130 emits, toward photoelectric conversion element 120 (light-receiving element), light emitted from end surface 161 of optical transmission member 160. Optical module 100 according to the present embodiment is an optical module for reception and transmission uses. The configurations of optical receptacle 130 are elaborated later.

The type of optical transmission member 160 is not limited. Optical transmission member 160 is inserted to insertion hole 145 described later. Examples of optical transmission member 160 include an optical fiber, a light waveguide, and the like. Optical transmission member 160 is connected to optical receptacle 130. In the present embodiment, optical transmission member 160 is an optical fiber. In addition, the optical fiber may be of a single mode type, or a multiple mode type.

Optical transmission member 160 includes multicore part 162 and single core part 163. Multicore part 162 is, for example, a tape core wire of optical fibers, and is composed of a plurality of optical fibers collected with a tape coating. Single core part 163 is formed by separating multicore part 162 into single cores for example. Single core part 163 is disposed in insertion hole 145 and first recess 140 of optical receptacle 130 described later. Multicore part 162 is disposed in second recess 141 of optical receptacle 130.

Configuration of Optical Receptacle

Figure 3A:
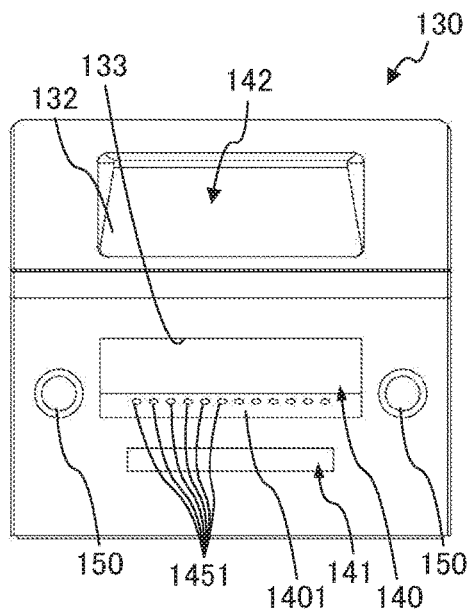
FIGS. 3A to 3E illustrate a configuration of an optical receptacle according to the embodiment of the present invention.
Figure 3C:
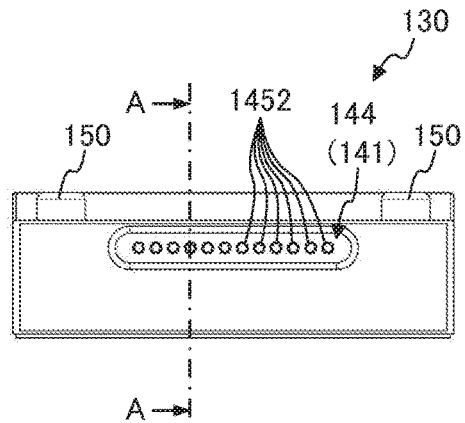
Figure 3B:
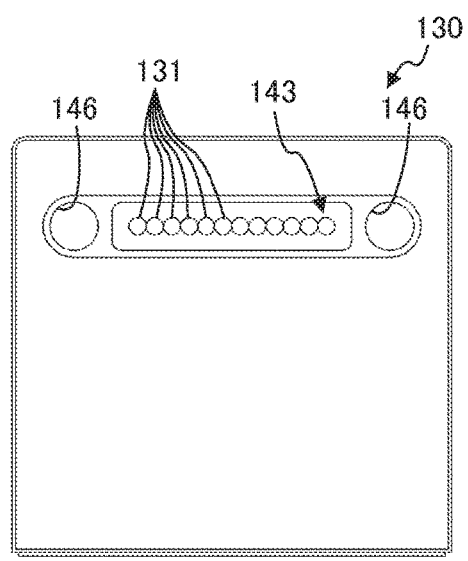
Figure 3D:
Figure 3E:
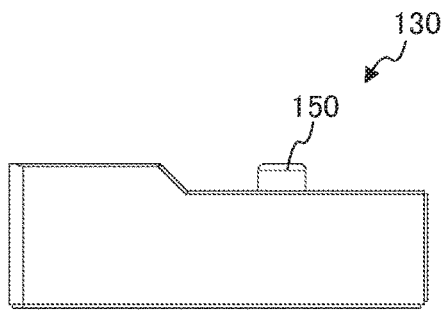

FIGS. 3A to 3E illustrate a configuration of optical receptacle 130 according to the present embodiment. FIG. 3A is a plan view of optical receptacle 130, FIG. 3B is a bottom view of optical receptacle 130, FIG. 3C is a front view of optical receptacle 130, FIG. 3D is a back view of optical receptacle 130, and FIG. 3E is a left side view of optical receptacle 130. In the following, a structural configuration of optical receptacle 130 is described, and thereafter a functional configuration of optical receptacle 130 is described.

Optical receptacle 130 is a member having a substantially cuboid shape. As illustrated in FIG. 2 and FIGS. 3A to 3E, in the present embodiment, optical receptacle 130 includes first recess 140, second recess 141 and third recess 142 formed in the top surface of optical receptacle 130, fourth recess 143 formed in the bottom surface of optical receptacle 130, slope surface 1401 disposed at the inner side surface of first recess 140, insertion hole 145 configured for insertion of optical transmission member 160 and communicating between first recess 140 and second recess 141, through hole 144 communicating between second recess 141 and the outside, reference part 150 disposed on the surface (top surface) on the side on which first recess 140 and second recess 141 open, and fifth recess (positioning recess) 146 formed in the bottom surface of optical receptacle 130. In the present embodiment, through hole 144, second recess 141, insertion hole 145 and first recess 140 are communicated with each other in this order from the front surface side of optical receptacle 130.

First recess 140 is a recess having a substantially rectangular prism shape which is formed at a center portion of the top surface of optical receptacle 130. Second optical surface 133 described later is disposed at the inner side surface of first recess 140 on the back side of optical receptacle 130, and slope surface 1401 is disposed opposite to second optical surface 133 at the inner side surface of first recess 140 on the front surface side of optical receptacle 130. Slope surface 1401 is tilted such that the distance from second optical surface 133 increases toward the opening of first recess 140 (the top surface). As elaborated later, the inclination angle of slope surface 1401 with respect to a plane perpendicular to the depth direction of first recess 140 is preferably 10 degrees to 60 degrees, more preferably, 10 degrees to 40 degrees. In the present embodiment, the plane perpendicular to the depth direction of first recess 140 and the bottom surface of optical receptacle 130 are parallel to each other. It suffices that slope surface 1401 is formed at a portion of the inner side surface of first recess 140 where one opening (first opening 1451 described later) of insertion hole 145 is disposed such that slope surface 1401 can be visually recognized from the opening side of first recess 140. A portion of the inner side surface of first recess 140 where first opening 1451 is not formed may or may not be tilted.

Second recess 141 is a recess having a substantially rectangular prism shape formed in a portion of the top surface on the front surface side of optical receptacle 130. The opening direction of second recess 141 is identical to that of first recess 140. First recess 140 and second recess 141 may open at the top surface of optical receptacle 130, or at the side surface of optical receptacle 130 as long as first recess 140 and second recess 141 open in the same direction. In addition, first recess 140 and second recess 141 may not open at the same plane. In the present embodiment, first recess 140 and second recess 141 open at the top surface side of optical receptacle 130 and on same plane. The other opening (second opening 1452 described later) of insertion hole 145 is disposed at the inner side surface of second recess 141 on the back side of optical receptacle 130. The inner side surface of second recess 141 may or may not be tilted with respect to the depth direction of second recess 141. For example, the inner side surface of second recess 141 may be tilted at an inclination angle corresponding to the releasing taper for the injection molding with respect to the depth direction of second recess 141. In addition, at the inner side surface of second recess 141 on the front surface side of optical receptacle 130, through hole 144 is formed opposite to second opening 1452 on the central axis of insertion hole 145.

An adhesive agent is supplied into first recess 140 and second recess 141 and cured in the state where single core part 163 of optical transmission member 160 is disposed in first recess 140 and insertion hole 145, and multicore part 162 is disposed in second recess 141. In this manner, optical transmission member 160 can be fixed to optical receptacle 130. The adhesive agent is a thermosetting resin or a photosetting resin for example, and the type of the adhesive agent is not limited as long as optical transmission member 160 can be fixed.

Third recess 142 is a recess having a substantially triangular prism shape formed in a portion of the top surface on the back side of optical receptacle 130. Reflection surface 132 described later is disposed at a part of the inner surface of third recess 142. In third recess 142, the inner surface facing reflection surface 132 may or may not be tilted with respect to the depth direction of third recess 142. For example, the inner side surface of third recess 142 may be tilted at an inclination angle corresponding to the releasing taper for the injection molding with respect to the depth direction of third recess 142.

Fourth recess 143 is a recess formed in the bottom surface of optical receptacle 130. First optical surface 131 described later is disposed at the bottom surface of fourth recess 143.

Through hole 144 is formed on the front surface side of optical receptacle 130 on the central axis of insertion hole 145 in such a manner as to communicate between second recess 141 and the outside. Through hole 144 functions as a guide of optical transmission member 160 when connecting optical transmission member 160 to optical receptacle 130, and functions also as a holding part of optical transmission member 160 (to be more specific, multicore part 162). Further, through hole 144 also function as an observing hole for measuring the position and the shape of second opening 1452 of insertion hole 145. The size of through hole 144 is greater than the opening of second opening 1452, for example, and is not limited as long as through hole 144 can function as an observing hole for measuring the position and the shape of second opening 1452. One or more through holes 144 are provided, and the number of through hole 144 is set in accordance with the number of first optical surface 131 and second optical surface 133. In the present embodiment, one through hole 144 is provided. The cross-sectional shape, the length, and the inclination angle of through hole 144 are not limited as long as the above-mentioned functions can be ensured. Examples of the cross-sectional shape of through hole 144 include a circular shape, a quadrangular shape and a polygonal shape. In the present embodiment, through hole 144 has a circular shape.

Insertion hole 145 is a linear through hole including first opening 1451 opening at slope surface 1401 of first recess 140, and second opening 1452 opening at the inner side surface of second recess 141. First opening 1451 and second opening 1452 are disposed at respective both ends of insertion hole 145. As described above, insertion hole 145 communicates between first recess 140 and second recess 141. In addition, insertion hole 145 functions as a guide of optical transmission member 160 when optical transmission member 160 is inserted to optical receptacle 130 from second recess 141 side, and also functions as the holding part of optical transmission member 160 (to be more specific, single core part 163). Two or more insertion holes 145 are provided, and the number of insertion holes 145 is set in accordance with the numbers of first optical surface 131 and second optical surface 133. In the present embodiment, twelve insertion holes 145 are provided. The cross-sectional shape, the width, the length, and the inclination angle of insertion hole 145 are not limited as long as the above-mentioned function can be ensured. The examples of the cross-sectional shape of insertion hole 145 include a circular shape, a quadrangular shape and a polygonal shape. In the present embodiment, insertion hole 145 has a circular shape. Preferably, insertion hole 145 is configured such that the central axis of insertion hole 145 is perpendicular to second optical surface 133 described later.

Reference part 150 is disposed on the surface on the side on which first recess 140 and second recess 141 open. In the present embodiment, reference part 150 is disposed on the top surface of optical receptacle 130. As elaborated later, reference part 150 serves as the reference position for measuring the position and the shape of insertion hole 145 (first opening 1451 and second opening 1452). The shape, the number, the arrangement and the size of reference part 150 are not limited as long as the above-mentioned function can be ensured. Examples of the shape of reference part 150 include a recessed shape and a protruding shape. Examples of the shape in plan view of reference part 150 include a circular shape, a quadrangular shape and a polygonal shape. In the present embodiment, reference part 150 is a pair of protrusions, and has a circular shape in plan view. In addition, in the present embodiment, the pair of protrusions are arranged parallel to the arrangement direction of insertion hole 145. Reference part 150 may be formed integrally with optical receptacle 130, or separated from optical receptacle 130.

Fifth recess 146 is a positioning recess that is fitted to the protrusion formed on substrate 110 so as to appropriately position twelve first optical surfaces 131 of optical receptacle 130 with respect to respective twelve photoelectric conversion elements 120. The shape, the number, the arrangement, and the size of fifth recess 146 are not limited, and are set in accordance with the shape of substrate 110 and the like. In the present embodiment, fifth recess 146 is a recess having a substantially columnar shape.

In addition, optical receptacle 130 includes first optical surface 131, reflection surface 132 and second optical surface 133. In the present embodiment, twelve first optical surfaces 131 are provided.

First optical surface 131 is an optical surface that allows light emitted from photoelectric conversion element 120 (light-emitting element) to enter optical receptacle 130, or emits, toward photoelectric conversion element 120 (light-receiving element), light passing through the inside of optical receptacle 130 after being emitted from end surface 161 of optical transmission member 160. The number of first optical surface 131 is not limited. In the present embodiment, as described above, twelve first optical surfaces 131 are provided. In optical receptacle 130 according to the present embodiment, six first optical surfaces 131 on the right side in FIG. 3B are used as first optical surface 131 of transmission side, and six first optical surfaces 131 on the left side in FIG. 3B are used as first optical surface 131 of reception side. On the bottom surface of optical receptacle 130, twelve first optical surfaces 131 are opposite to respective twelve photoelectric conversion elements 120. In the present embodiment, twelve first optical surfaces 131 are disposed in a line on the bottom surface of fourth recess 143 provided on the rear side (bottom surface) of optical receptacle 130. The shape of first optical surface 131 is not limited. In the present embodiment, first optical surface 131 is a convex lens surface protruding toward photoelectric conversion element 120. In addition, in plan view, first optical surface 131 has a circular shape. Preferably, the central axis of first optical surface 131 is perpendicular to the light-emitting surface or the light-receiving surface of photoelectric conversion element 120 (and the surface of substrate 110). In addition, preferably, the central axis of first optical surface 131 coincides with optical axis OA of light emitted from photoelectric conversion element 120 (light-emitting element), or light incident on photoelectric conversion element 120 (light-receiving element).

Reflection surface 132 is an optical surface that reflects light incident on first optical surface 131 toward second optical surface 133, or reflects light incident on second optical surface 133 toward first optical surface 131. Reflection surface 132 is a part of the inner surface of third recess 142. Reflection surface 132 is tilted such that the distance to optical transmission member 160, which is disposed on the front side, decreases from the bottom surface toward the top surface of optical receptacle 130. The inclination angle of reflection surface 132 is not limited. In the present embodiment, the inclination angle of reflection surface 132 is 45 degrees with respect to optical axis OA of light incident on reflection surface 132. The shape of reflection surface 132 is not limited. In the present embodiment, reflection surface 132 is a flat surface. Light incident on first optical surface 131 or second optical surface 133 impinges on reflection surface 132 at an incident angle greater than the critical angle.

Second optical surface 133 is an optical surface that emits, toward end surface 161 of optical transmission member 160, light passing through the inside of optical receptacle 130 after impinging on first optical surface 131, or allows light emitted from end surface 161 of optical transmission member 160 to enter optical receptacle 130. Second optical surface 133 is disposed at a part of the inner side surface of first recess 140 so as to face slope surface 1401 (first opening 1451). End surface 161 of optical transmission member 160 is disposed opposite to second optical surface 133. The shape of second optical surface 133 is not limited. In the present embodiment, second optical surface 133 is parallel to the depth direction of first recess 140. Preferably, second optical surface 133 is perpendicular to optical transmission member 160. In addition, preferably, second optical surface 133 is perpendicular to optical axis OA of light emitted from end surface 161 of optical transmission member 160, or light incident on end surface 161 of optical transmission member 160. With this configuration, it is possible to allow light emitted from end surface 161 of optical transmission member 160 to enter optical receptacle 130 without refracting the light, and it is possible to emit, to the outside of optical receptacle 130, light incident on end surface 161 of optical transmission member 160 without refracting the light.

Optical receptacle 130 is formed of a material that is transparent to light of a wavelength used in optical communications. Examples of the material of optical receptacle 130 include transparent resins such as polyetherimide (PEI) and cyclic olefin resin. Optical receptacle 130 is manufactured by injection molding, for example.

Light Path in Optical Module

Next, light paths in optical module 100 according to the present embodiment are described.

In a portion that functions as optical module 100 for transmission use, light emitted from photoelectric conversion element 120 (light-emitting element) enters optical receptacle 130 from first optical surface 131. At this time, the incident light is converted to collimate light by first optical surface 131, and advances toward reflection surface 132. Then, the incident light is reflected by reflection surface 132, and advances toward second optical surface 133. The light having reached second optical surface 133 is emitted out of optical receptacle 130 from second optical surface 133, and reaches end surface 161 of optical transmission member 160.

On the other hand, in a portion that functions as optical module 100 for reception use, light emitted from end surface 161 of optical transmission member 160 enters optical receptacle 130 from second optical surface 133, and advances toward reflection surface 132. Then, the incident light is reflected by reflection surface 132, and advances toward first optical surface 131. The light having reached first optical surface 131 is emitted out of optical receptacle 130 from first optical surface 131, and reaches photoelectric conversion element 120 (light-receiving element). At this time, the emission light reaches the center of the light-receiving surface of photoelectric conversion element 120 (light-receiving element) while being condensed by first optical surface 131.

In the above-mentioned configuration, optical receptacle 130 according to the present embodiment can optically couple photoelectric conversion element 120 and the end surface of optical transmission member 160 in an appropriate manner.

Method of Measuring Position and Shape of Insertion Hole

Next, a method of measuring the position and the shape of insertion hole 145 of optical receptacle 130 according to the present embodiment with a laser probe in a noncontact manner (a measurement method according to the present embodiment) is described. In the measurement method according to the present embodiment, a non-contact three-dimensional measuring device using a publicly known laser probe can be used. Further, in the present embodiment, a method of measuring the width (in the present embodiment, the diameter) and the inclination angle of insertion hole 145 based on the measured position and shape of insertion hole 145 are also described.

Figure 4A:
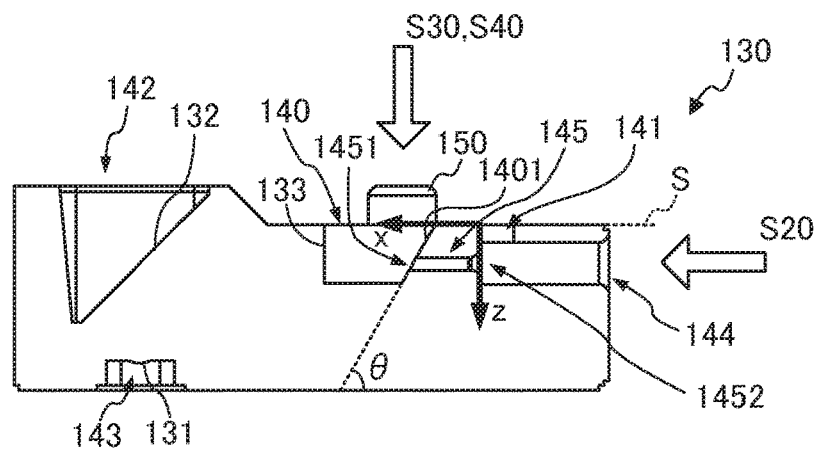
FIGS. 4A to 4C illustrate a method of measuring the position and the shape of an insertion hole of the optical receptacle according to the embodiment of the present invention.
Figure 4B:
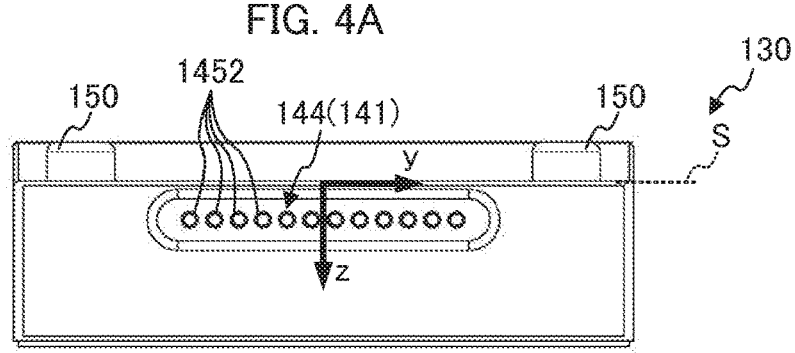
Figure 4C:
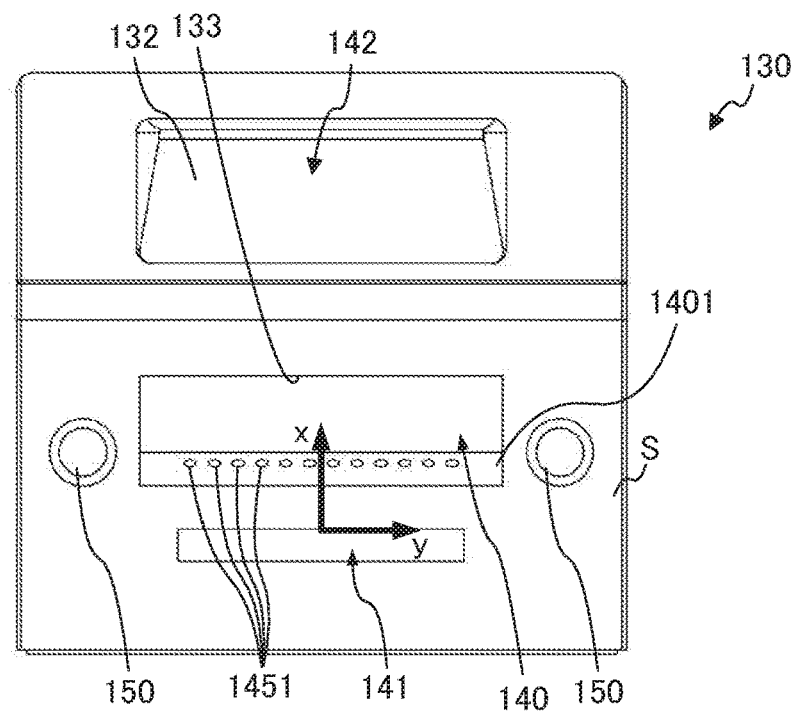

FIGS. 4A to 4C illustrate a method of measuring the position and the shape of insertion hole 145 in optical receptacle 130. FIG. 4A is a sectional view of optical receptacle 130, FIG. 4B is a front view of optical receptacle 130, and FIG. 4C is a plan view of optical receptacle 130. FIG. 4A is a sectional view taken along line A-A of FIG. 3C, in which hatching of optical receptacle 130 is omitted. In the following, as illustrated in FIGS. 4A to 4C, the x-axis direction is the direction from the front side to the back side of optical receptacle 130, the y-axis direction is the direction from the left side to the right side of optical receptacle 130, and the z-axis direction is the direction from the top side to the bottom side. In the present embodiment, the x-axis direction is parallel to the central axis of insertion hole 145, the y-axis direction is parallel to the arrangement direction of insertion hole 145, and the z-axis direction is parallel to the depth direction of first recess 140 and second recess 141. In addition, a y-z plane including second opening 1452 is set as a reference (0, y, z) in the x-axis direction, a z-x plane including the center of optical receptacle 130 in the arrangement direction (the y-axis direction) of insertion hole 145 is set as a reference (x, 0, z) in the y-axis direction, and an x-y plane of optical receptacle 130 on which reference part 150 is disposed (hereinafter referred to as "reference surface S") is set as a reference (x, y, 0) in the z-axis direction. In addition, the position of first opening 1451 of each insertion hole 145 is represented by A1 $(x_i, y_i, z_i)(i=1$ to 12$)$, and the position of second opening 1452 of each insertion hole 145 is represented by A2 $(x_i, y_i, z_i)(i=1$ to 12$)$. Here, i represents the positions of insertion holes 145 in the arrangement direction of insertion hole 145, which are numbered from the left side as viewed from the front side of optical receptacle 130. It is to be noted that, in FIG. 4A, the white large arrow indicates the measurement direction in the steps.

Figure 5:
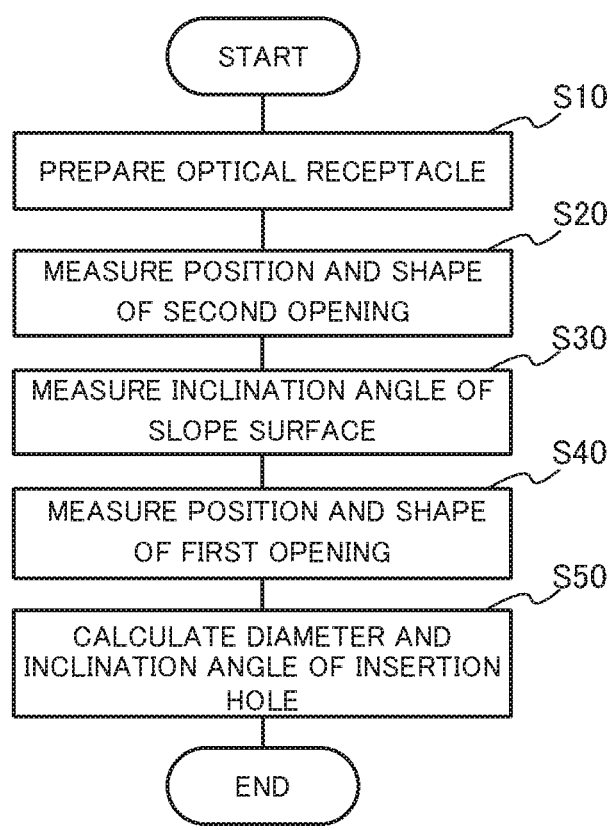
FIG. 5 is a flowchart of an exemplary measurement method according to the embodiment of the present invention.

FIG. 5 is a flowchart of an exemplary measurement method according to the present embodiment. The measurement method according to the present embodiment includes a step of preparing optical receptacle 130 according to the present embodiment (S10), a step of measuring position A2 and the shape of second opening 1452 of insertion hole 145 through via hole 144 (S20), a step of measuring inclination angle θ of slope surface 1401 from reference surface S side (S30), a step of measuring position A1 and the shape of first opening 1451 of insertion hole 145 from reference surface S side (S40), and a step of calculating the diameter and the inclination angle of insertion hole 145 (S50).

First, optical receptacle 130 according to the present embodiment is prepared, and installed in the measurement device (step S10).

Next, position A2 $(x_i, y_i, z_i)$ and the shape of second opening 1452 of insertion hole 145 are measured (step S20). To be more specific, the position $(y_i$ and $z_i)$ and the shape of second opening 1452 in the y-axis direction and the z-axis direction are measured via through hole 144 based on the positional relationship between second opening 1452, and reference surface S and reference part 150 (see FIG. 4A). Position $(x_i)$ of second opening 1452 in the x-axis direction is defined based on the positional relationship between second opening 1452 and reference part 150 on reference surface S. In the present embodiment, as described above, the surface including second opening 1452 is set as the reference in the x-axis direction, and therefore xi is defined as 0. At this time, since second recess 141 of optical receptacle 130 functions as an observing hole, position ($x_i$) of second opening 1452 in the x-axis direction can be correctly determined. In addition, from the viewpoint of measuring position A2 ($x_i$, $y_i$, $z_i$) and the shape of second opening 1452 with high accuracy, the number of measurement points is preferably 600 or greater.

Next, inclination angle θ of slope surface 1401 is measured (step S30). To be more specific, the inclination angle of the bottom surface (installation plane) of optical receptacle 130 and the inclination angle of slope surface 1401 with respect to reference surface (0 degrees) in the device are measured from reference surface S side (see FIG. 4A) with a measurement device, and the difference therebetween is calculated to measure inclination angle θ of slope surface 1401 with respect to the plane perpendicular to the depth direction of the first recess.

Next, position A1 ($x_i$, $y_i$, $z_i$) and the shape of first opening 1451 of insertion hole 145 are measured (step S40). To be more specific, position A1 and the shape of first opening 1451 of insertion hole 145 are measured from reference surface S side based on the positional relationship between first opening 1451 and reference part 150, and inclination angle θ of slope surface 1401 (see FIG. 4A). To be more specific, the position ($x_i$ and $y_i$) and the shape in the plane direction (the x-axis direction and the y-axis direction) of reference surface S are measured from reference surface S side based on the positional relationship between first opening 1451 and reference part 150. Since slope surface 1401 is formed at a portion of the inner side surface of first recess 140 where first opening 1451 is disposed, the position ($z_i$) of first opening 1451 in the z-axis direction can be calculated based on the position ($x_i$ and $y_i$) and the shape of first opening 1451 in the plane direction of reference surface S and inclination angle θ of slope surface 1401, and as a result, position A1 and the shape of first opening 1451 can be measured. In view of appropriately measuring position A1 and the shape of first opening 1451 from reference surface S side, inclination angle θ of slope surface 1401 with respect to the plane perpendicular to the depth direction of first recess 140 (the z-axis direction) (in the present embodiment, the bottom surface of optical receptacle 130) is preferably 10 degrees to 60 degrees and more preferably, 10 degrees to 40 degrees. In addition, in view of measuring position A1 ($x_i$, $y_i$, $z_i$) and the shape of first opening 1451 with high accuracy, the number of the measurement points is preferably 600 or greater.

Through the above-mentioned steps, the positions (position A1 of first opening 1451 and position A2 of second opening 1452) and the shape of linear insertion hole 145 can be measured. Thus, the positional accuracy of insertion hole 145 can be confirmed.

Finally, the diameter and the inclination angle of insertion hole 145 are calculated (step S50). To be more specific, the diameter of insertion hole 145 and the inclination angle of insertion hole 145 are calculated based on position A1 ($x_i$, $y_i$, $z_i$) and the shape of first opening 1451 of insertion hole 145 and position A2 ($x_i$, $y_i$, $z_i$) and the shape of second opening 1452 measured at step S20 and step S40.

Effect

In optical receptacle 130 according to the present embodiment, slope surface 1401 is formed at a portion of the inner side surface of first recess 140 where first opening 1451 of insertion hole 145 is disposed. With this configuration, the position and the shape of insertion hole 145 can be correctly measured from above even when second optical surface 133 is disposed opposite to first opening 1451. In addition, with the present embodiment, the diameter and the inclination angle can also be measured. In addition, in the present embodiment, second recess 141 opens at reference surface S, and thus the position of second opening 1452 of insertion hole 145 in the x-axis direction can be correctly determined. Further, with first recess 140 and second recess 141 opening in the same direction, the positions and the shapes of first opening 1451 and second opening 1452 can be measured based on the positional relationship with common reference part 150, and accordingly the position and the shape of insertion hole 145 (first opening 1451 and second opening 1452) can be correctly measured.

While position A1 and the shape of first opening 1451 are measured after position A2 and the shape of second opening 1452 are measured in the present embodiment, the present invention is not limited to the measurement of this order. For example, position A2 and the shape of second opening 1452 may be measured after position A1 and the shape of first opening 1451 are measured.

In addition, while optical receptacle 130 according to the embodiment includes reflection surface 132, reflection surface 132 may not be provided. In this case, the first optical surface and the second optical surface are disposed on the opposite sides in the optical receptacle. Then, at the portion that functions as the optical module for transmission use, light emitted from the photoelectric conversion element (light-emitting element) enters the optical receptacle from the first optical surface. The incident light reaches the second optical surface without being reflected by reflection surface 132, and is then emitted out of the optical receptacle from the second optical surface. Finally, the emission light reaches the end surface of the optical transmission member. On the other hand, in the portion that functions as the optical module for reception use, light emitted from the end surface of the optical transmission member enters the optical receptacle from the second optical surface. The incident light reaches the first optical surface, and is then emitted out of the optical receptacle from the first optical surface. Finally, the emission light reaches the photoelectric conversion element (light-receiving element).

Further, while two or more first optical surfaces 131 and two or more insertion holes 145 are provided in optical receptacle 130 according to the embodiment, the present invention is not limited to this. In the present invention, one first optical surface and one insertion hole may be provided. In this case, in the optical module, one photoelectric conversion element, and one optical transmission member are used.

This application is entitled to and claims the benefit of Japanese Patent Application No. 2016-000128 filed on Jan. 4, 2016, the disclosure each of which including the specification, drawings and abstract is incorporated herein by reference in its entirety.

INDUSTRIAL APPLICABILITY

The optical receptacle and the optical module according to the embodiment of the present invention are suitable for optical communications using an optical transmission member.

REFERENCE SIGNS LIST

10 Optical module
20 Substrate

30 Photoelectric conversion element
40 Optical receptacle
41 First optical surface
42 Reflection surface
43 Second optical surface
44 First recess
45 Second recess
46 First insertion hole
461 First opening
462 Second opening
47 Second insertion hole
50 Optical transmission member
51 End surface of optical transmission member
100 Optical module
110 Substrate
120 Photoelectric conversion element
130 Optical receptacle
131 First optical surface
132 Reflection surface
133 Second optical surface
140 First recess
1401 Slope surface
141 Second recess
142 Third recess
143 Fourth recess
144 Through hole
145 Insertion hole
1451 First opening
1452 Second opening
146 Fifth recess
150 Reference part
160 Optical transmission member
161 End surface of optical transmission member
162 Multicore part
163 Single core part
OA Optical axis
S Reference surface
θ Inclination angle of slope surface

The invention claimed is:

1. An optical receptacle configured to be disposed between a photoelectric conversion element and an optical transmission member, and to optically couple the photoelectric conversion element and an end surface of the optical transmission member, the optical receptacle comprising:
a first optical surface configured to allow incidence of light emitted from the photoelectric conversion element, or to emit, toward the photoelectric conversion element, light emitted from the end surface of the optical transmission member and passing through inside of the optical receptacle;
a second optical surface configured to emit, toward the end surface of the optical transmission member, light incident on the first optical surface that passes through the inside of the optical receptacle, or to allow incidence of light emitted from the end surface of the optical transmission member;
a first recess in which the second optical surface is disposed in a part as an inner side surface of the first recess;
a second recess opening in a direction identical to a direction in which the first recess opens;
a slope surface that is another inner side surface of the first recess, the slope surface being disposed opposite to the second optical surface in the first recess, the slope surface being tilted with respect to the second optical surface such that a distance of the slope surface from the second optical surface increases toward an opening of the first recess;
an insertion hole having a linear shape and including a first opening and a second opening disposed at respective ends of the insertion hole, wherein the first opening opens at the slope surface of the first recess, the second opening opens at an inner side surface of the second recess, and the insertion hole is configured for insertion of the optical transmission member from the second recess side;
a through hole formed opposite to the second opening on a central axis of the insertion hole and communicating between the second recess and outside of the optical receptacle; and
a reference part disposed on a surface of the optical receptacle on a side on which the first recess and the second recess open, the reference part being disposed such that the reference art does not cover the first recess and the second recess.

2. The optical receptacle according to claim 1, wherein an inclination angle of the slope surface with respect to a plane perpendicular to a depth direction of the first recess is 10 degrees to 60 degrees.

3. The optical receptacle according to claim 1, wherein the reference part is a pair of protrusions or a pair of recesses.

4. The optical receptacle according to claim 1, further comprising, a reflection surface configured to reflect light incident on the first optical surface toward the second optical surface, or to reflect light incident on the second optical surface toward the first optical surface.

5. An optical module comprising:
a substrate;
a photoelectric conversion element disposed on the substrate; and
the optical receptacle according to claim 1 in which the first optical surfaces is disposed opposite to the photoelectric conversion element on the substrate.

6. A method of measuring a position and a shape of the insertion hole in the optical receptacle according to claim 1 with a laser probe in a noncontact manner, the method comprising:
providing the optical receptacle according to claim 1;
measuring a position and a shape of the second opening via the through hole based on a positional relationship between the second opening, and a reference surface and the reference part, wherein the reference surface is a surface on which the reference part is disposed in the optical receptacle;
measuring, from a reference surface side, an inclination angle of the slope surface; and
measuring, from the reference surface side, a position and a shape of the first opening based on a positional relationship between the first opening on the slope surface and the reference part, and the inclination angle of the slope surface.

7. The method according to claim 6, further comprising: calculating a width of the insertion hole based on the position and the shape of the first opening and the position and the shape of the second opening.

8. The method according to claim 6, further comprising: calculating an inclination angle of the insertion hole based on a positional relationship between the first opening and the second opening.

* * * * *